(12) United States Patent
Ni

(10) Patent No.: US 6,693,336 B1
(45) Date of Patent: Feb. 17, 2004

(54) INTERGRATED CIRCUIT CHIP PACKAGE WITH REDUCED PARAMETER OFFSETS

(76) Inventor: James Seng-Ju Ni, 1679 Kamsack Dr., Sunnyvale, CA (US) 94087

( * ) Notice: Subject to any disclaimer, the term of this patent is extended or adjusted under 35 U.S.C. 154(b) by 0 days.

(21) Appl. No.: 10/336,331

(22) Filed: Jan. 6, 2003

(51) Int. Cl.⁷ .............................................. H01L 29/72
(52) U.S. Cl. ...................... 257/433; 257/701; 257/704; 257/787; 257/788; 438/15; 438/25; 438/106; 438/127
(58) Field of Search ................................. 257/433, 787, 257/788, 701, 704; 438/106, 127, 15, 25

(56) References Cited

U.S. PATENT DOCUMENTS

2003/0019299 A1 * 1/2003 Horie et al. ................. 257/433

* cited by examiner

Primary Examiner—Edward Wojciechowicz

(57) ABSTRACT

A semiconductor encapsulated package is provided with buffer chambers established through external openings aligned with stress sensitive circuitry sites, wherein the viscosity of the encapsulating molding compound and the opening are interrelated to limit compound flow into the buffer chambers thereby providing an internal voids at the sites limiting induced mechanical and thermal stresses.

14 Claims, 7 Drawing Sheets

INTERGRATED CIRCUIT CHIP PACKAGE WITH REDUCED PARAMETER OFFSETS

FIELD OF THE INVENTION

This invention relates to semiconductor devices packaged in encapsulating materials, and more particularly, an encapsulation package for precision analog integrated circuit chips that reduces parameter offsets and improves manufacturing yields.

BACKGROUND OF THE INVENTION

Plastic encapsulation of integrated circuits has generally provided the most cost-effective packaging technique for high-precision analog products. Typically, after wafer fabrication process and conversion to silicon dice, discrete chips are attached to a metal lead frame. Thereafter, wire bonds are connected at bond pads on the chip to their corresponding interconnection leads. A plastic molding compound is then applied to the chip unit to provide package encapsulation. High-precision and high-sensitivity analog ICs have long suffered considerable yield loss after being encapsulated in plastic packages as a result of package related mechanical stress effects. The exertion of mechanical stress on piezoelectric materials, such as silicon, generates small but noticeable offset voltages that are capable of altering unacceptably the electrical performance of the circuits.

To overcome this problem, it has been proposed to apply a coating polymer layer, such as silicone gel or polyimide, to form a buffer region between molding compound and underlying silicon chip, as described by Roberts, Jr. in U.S. Pat. No. 5,026,667. The application of the extra polymer buffer layer has suffered from lack of thickness control and unpredictable improvement problems, as well as added manufacturing costs.

To overcome these limitations, offset adjustment circuitry needs to be provided or additional connecting leads need to be reserved to allow adjustment to product specifications. Undesirably, the adjustment circuitry requires additional silicon area and the additional leads require additional package spare pins and longer test times. Unfortunately, all of the above add significant manufacturing costs to the integrated circuits. Accordingly, a more cost-effective approach to alleviate the above shortcomings has been a long felt need. It is an object of this invention to solve that problem.

SUMMARY OF THE INVENTION

The present invention provides an embedded buffer volume between the package molding compound and the encapsulated silicon chip surface to avoid mechanical stress effects. The IC chip is fabricated in a conventional manner up to the contact pad-opening step. During contact pad opening, additional holes, smaller than the typical contact pad size, are opened on the second protection layer and followed by a subsequent removal of the first protection layer material under the holes using a wet chemical etch process. The resulting voids are bounded by the second protection layer on top and a metal layer at bottom, thereby providing a buffer region between encapsulating molding compound and the underlying stress-sensitive silicon areas in a plastic packaged IC chip. The layout of hole patterns is carefully considered such that the second protection layer provides enough mechanical strength to hold molding compound with the underlining first protection layer removed. The size of individual holes is selected to prevent the viscous molding compound from penetrating through the holes during the encapsulating process. Consequently, stress-sensitive circuitry areas in the resulting IC chip are insulated from the mechanical stress by the molding compound thereby achieving much smaller IC parameter offsets and higher product yields.

Accordingly, it is an object of present invention to provide improved semiconductor device structures for encapsulating analog IC chips in plastic packages.

Another object to the invention reside in reducing parameter offsets in encapsulated analog IC chips without additional circuitry or contact pins are required.

A further object is to provide improved performance on encapsulated IC chips through structural modification at the wafer level.

BRIEF DESCRIPTION OF THE DRAWINGS

The above and other objects and advantages of the present invention will become apparent upon reading the accompanying written description taken in conjunction with the following drawings in which.

DETAILED DESCRIPTION OF THE PREFERRED EMBODIMENTS

Figure 1:
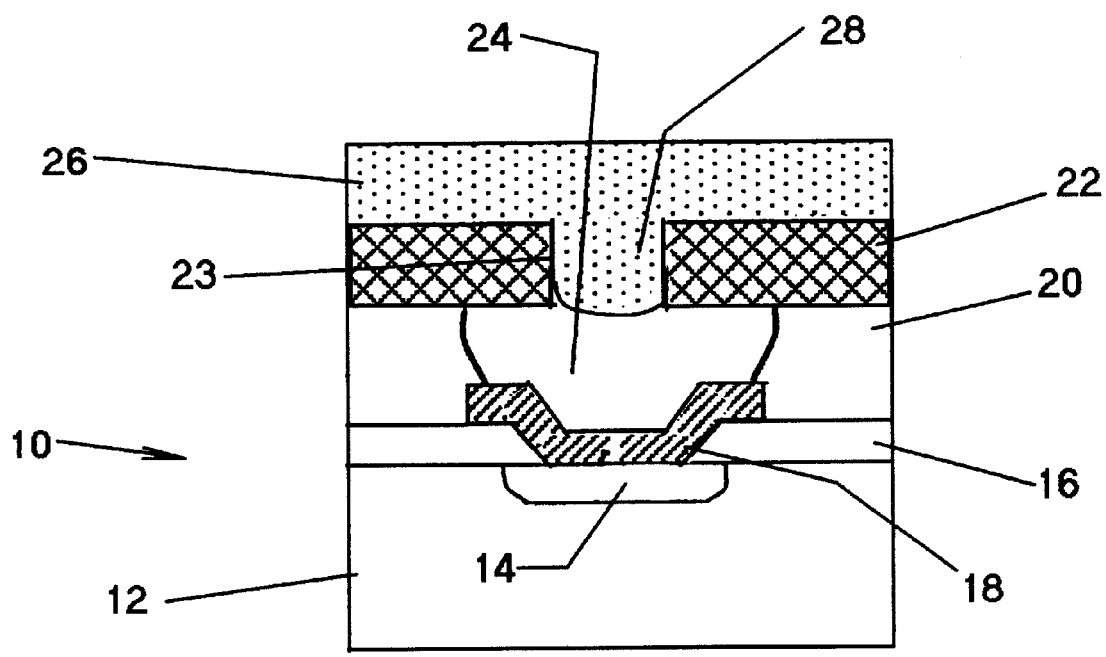
FIG. 1 is a fragmentary side elevational view of an encapsulated integrated circuit package in accordance with an embodiment of the invention.

Referring to the drawings for the purposes of illustrating preferred embodiments of the invention and not for limiting same, FIG. 1 shows an encapsulated integrated circuit package 10 having reduced parameter offsets. The package 10 includes a silicon base substrate 12 having a doped area 14 of opposite type. In the present embodiment, the substrate is a p-type, however, it will be apparent that n-type substrate may also be employed. A first insulating layer 16, of a suitable material such as a thermal oxide, a silicon oxide or a borophosphosilicate glass (BPSG), is grown on the top surface of the base substrate and conventionally etched to provide a frustoconical window communicating with the doped area 14. The layer 16 and window are covered with a metal film such as aluminum, copper, alloys thereof, or other suitable electrically conductive films. The film is conventionally patterned and etched to establish an electrical contact 18 together with associated circuitry, not shown. The patterned metal film and layer 16 are covered in a conventional manner with a first protection or passivation layer 20 and a second protection or passivation layer 22. A suitable material for the first layer is a silicon oxide, phophosilicate glass or similar material. A suitable material for the second layer is silicon based material such as silicon nitride or silicon oxynitride. The second layer 22 includes an access aperture 23 that communicates with an outwardly peripherally expanded buffer chamber 24 extending inwardly of the peripheral margins of the contact 18 and/or adjacent film circuitry, thereby forming an etching stop in the formation of the chamber 24 as described below. The preform device is encapsulated with a molding compound outer layer 26 having a plug 28 projecting into the aperture 23 and spaced from the contact 18 by the buffer chamber 24. The aperture is preferably circular or otherwise geometric having a sufficiently small area that limits flow and penetration of the molding compound material therethrough, based on viscosity and pressurization properties. The width of the apertures is preferably in the range of about 2 to 20 um. In arrays described below, the apertures are mutually spaced to obtain desired buffering effects, while providing sufficient mechanical strength in the underlying strata. A separation width of about 5 to 40 um is preferred. With the above representative fabrication, the thermal/mechanical stresses and resultant piezoelectric effects are substantially reduced at the stress prone connection areas resulting in reduced parameter offsets and thereby increasing manufacturing yield by eliminating and/or reducing post fabrication calibrating and supplemental circuitry.

Figure 2:
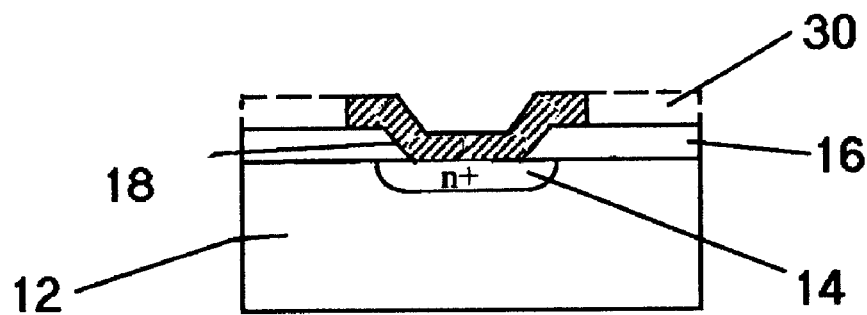
FIG. 2 is a fragmentary cross-sectional view of the package of FIG. 1 at a preliminary stage of fabrication.
Figure 3:
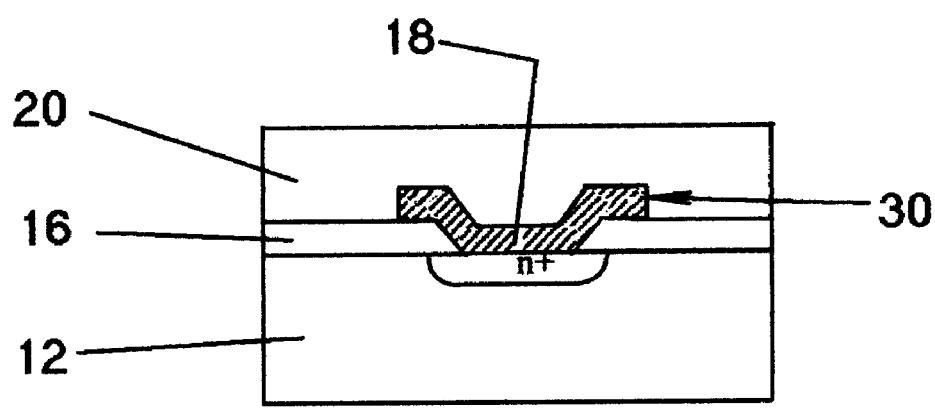
FIG. 3 is a fragmentary cross sectional view of the package of FIG. 1 at a secondary stage of manufacture.

Referring to FIG. 2, the preform device is fabricated in a conventional manner comprising forming the base substrate 12 including doped area 14 having an overlying first insulating layer 16 including a frustoconical contact pad window 18 registering with the doped area 14. A metal film 30 is deposited in a conventional manner on the exposed upper surface. Thereafter, as shown in FIG. 3, the metal film 30 is patterned and etched to establish the conductive circuitry and the contact 18 and covered by the first protection layer 20.

Figure 5:
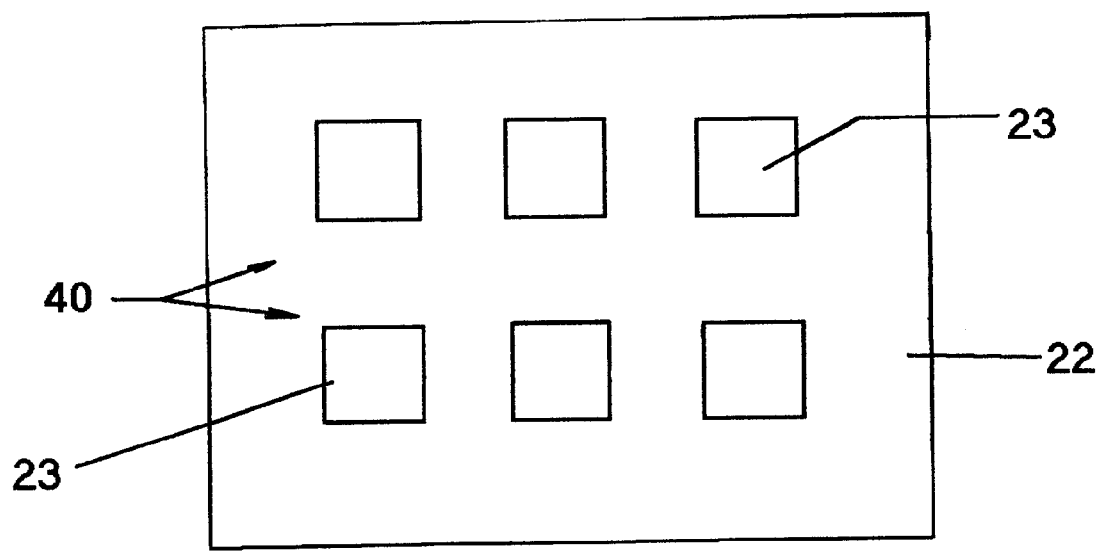
FIG. 5 is a top view of FIG. 4 showing an array of access openings.
Figure 4:
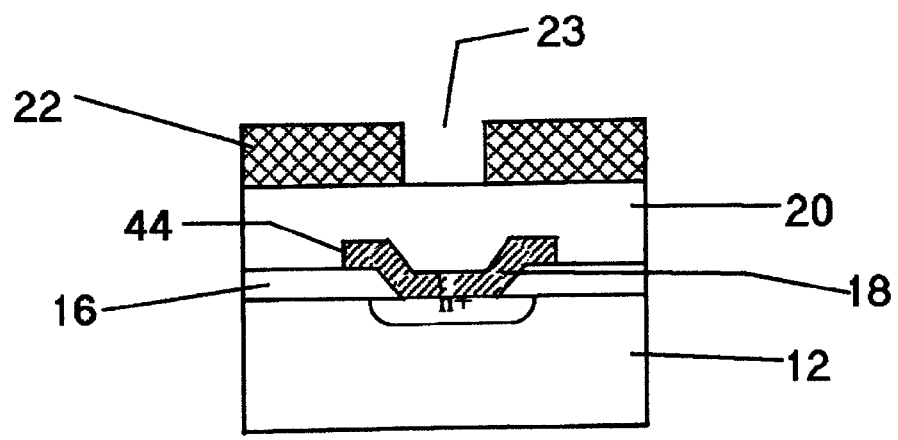
FIG. 4 is a fragmentary cross sectional view of the package prior to forming the buffer chamber.

As shown in FIG. 4, the second protection layer 22 having a thickness between about 0.4 and 1.0 um is deposited on top of the layer 20. The layer 22 is patterned and plasma etched to define the apertures 23 and a desired overall aperture array or pattern 40 as shown in FIG. 5. The holes 46 are aligned with the underlying stress-sensitive circuitry areas including the contact 18. The surrounding periphery 44 of the contact 18 is arranged to extend outwardly of the hole projection thereby forming an etch stop layer for the subsequent wet chemical etch of the first protection layer 20 as described below. The purpose of having metal periphery under the aperture 23 is to keep the first insulating layer 16 from being removed during the wet chemical etch of the first protection layer, inasmuch as the wet chemical solution does not substantially differentiate between the two materials.

Figure 7:
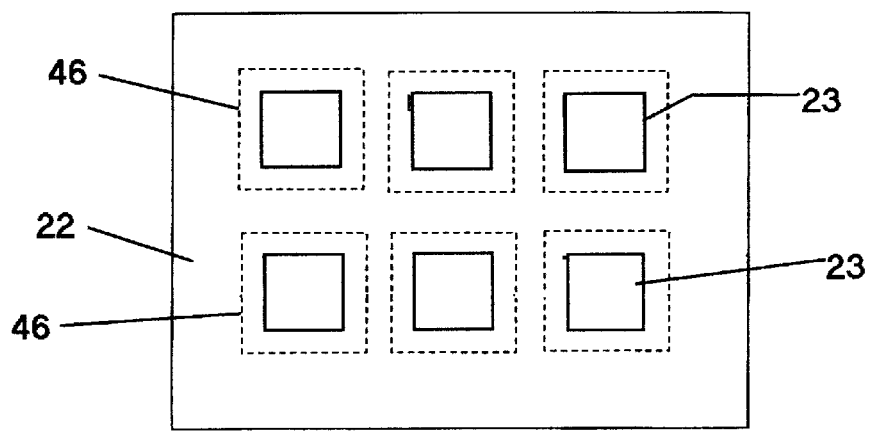
FIG. 7 is a top view of FIG. 6 showing the array of access openings with the buffer chamber boundaries shown in dashed lines.
Figure 6:
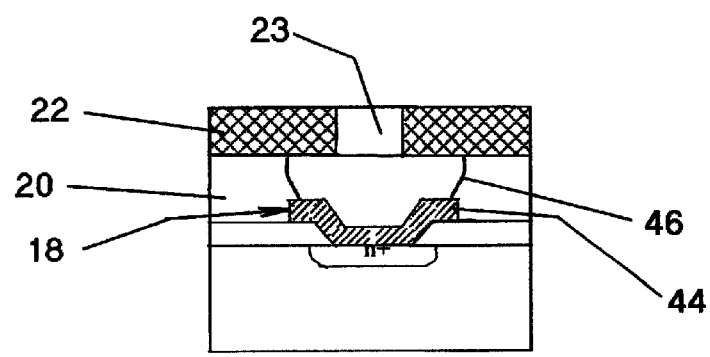
FIG. 6 is a fragmentary cross sectional view of the package after formation of the buffer chamber.
Figure 8:
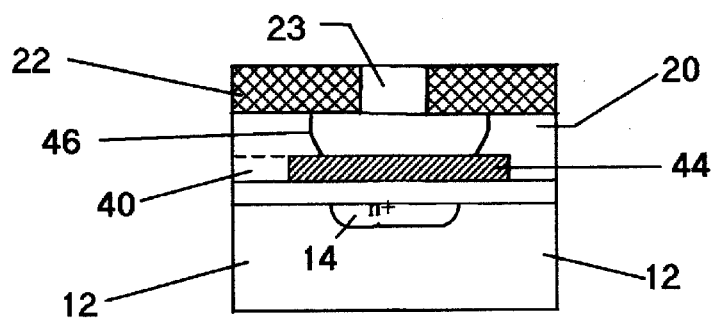
FIG. 8 is a fragmentary cross sectional view of a package according to another embodiment of the invention prior to encapsulation.

With reference to FIGS. 6 and 7, a wet oxide etch solution, such as BOE, is used to etch the layer 22 beneath and outwardly of the apertures 23. The layer 22 acts as a mask as BOE etches the underlying first protection layer. The removal in the vertical direction is bounded by the underlying metal film 40 and layer 22 and laterally bounded by an annular wall 46, which extends beyond the aperture edge by a distance of about 1–5 um. Following the etching, the second protection layer 22 is then separated from the metal film 40, the contact 18 and the like by the buffer chamber 24 eliminating shear stresses thereat.

Figure 9:
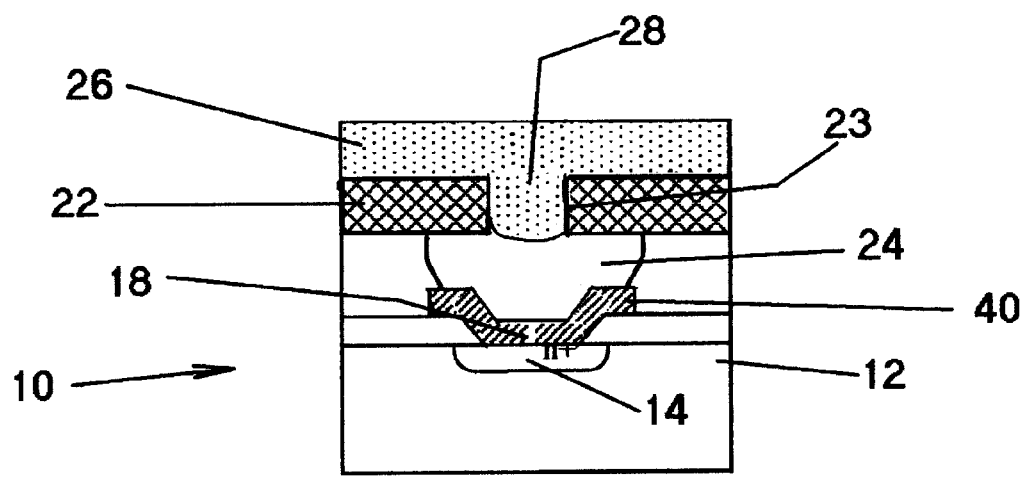
FIG. 9 is a fragmentary cross sectional view of the package of FIG. 7 after encapsulation.

After conventional wire bonding, the device proceeds to the plastic encapsulation as shown in FIG. 9. During the encapsulation process, the molding compound 26 is molded around the second protection layer 22 and the plug 28 penetrates the apertures 23 stopping short of the buffer cavity 24 due to its viscosity and pressure buildup, resulting in an encapsulated buffer chamber 24. Hence the mechanical stress associated with the relative expansion of the molding compound and the interfaces is not transmitted to the circuitry and is thus isolated from the underlying stress-sensitive areas by buffer layers consisting of the second protection layer 22, the air cushion chamber 24, the metal layer 40, and the first insulating layer 16. The resulting IC chip has much lower parameter offset values due to the lack of piezoelectric effects on the stress-sensitive areas and consequently, higher IC parametric yields are accomplished.

Although in this preferred embodiment, the layer 40 is applied as an etch stop, it maybe in some applications that the metal layer 40 can be omitted. The etch stop function can be implemented through careful timing of the wet oxide etch and thus etch into the insulating layer 1 can be minimized.

Figure 10:
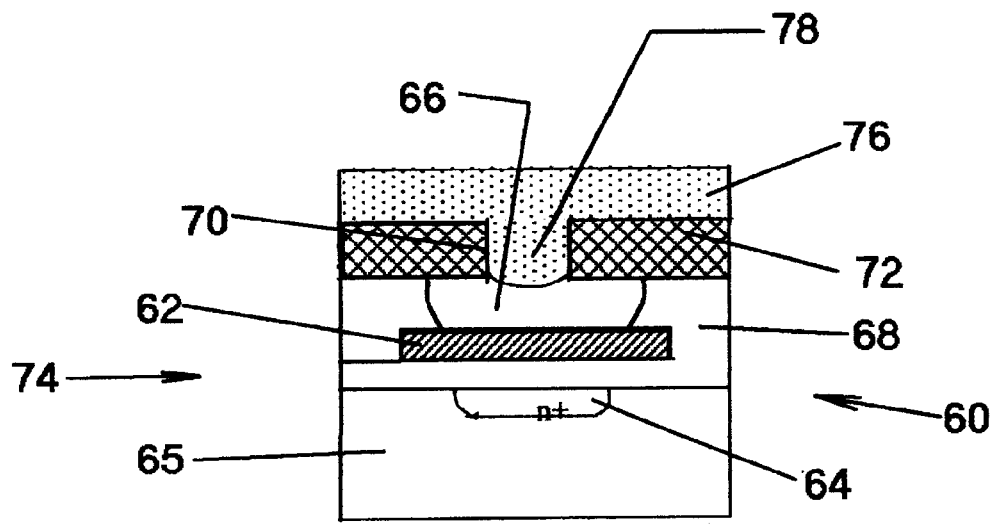
FIG. 10 is a fragmentary cross sectional view of the package of FIG. 8 after encapsulation.

The isolation techniques as described above may also be employed at other stress sensitive areas of encapsulated IC devices. Referring to FIG. 10, a device 60 may include a circuitry path 62 overlying a doped area 64 in the base substrate 65 presenting unwanted stress effects at the interfaces with the first insulation layer 64. To obviate such effects, a chamber 66 is formed in the second insulation layer 68 through access aperture 70 in protective layer 72 as described above. The encapsulated device 74 is shown in FIG. 10 wherein the molded outer encapsulating layer 76 surrounds the layer 72 with a plug 78 penetrating the aperture 70 and terminating at the chamber 66 due to its viscosity and pressure buildup.

Figure 11:
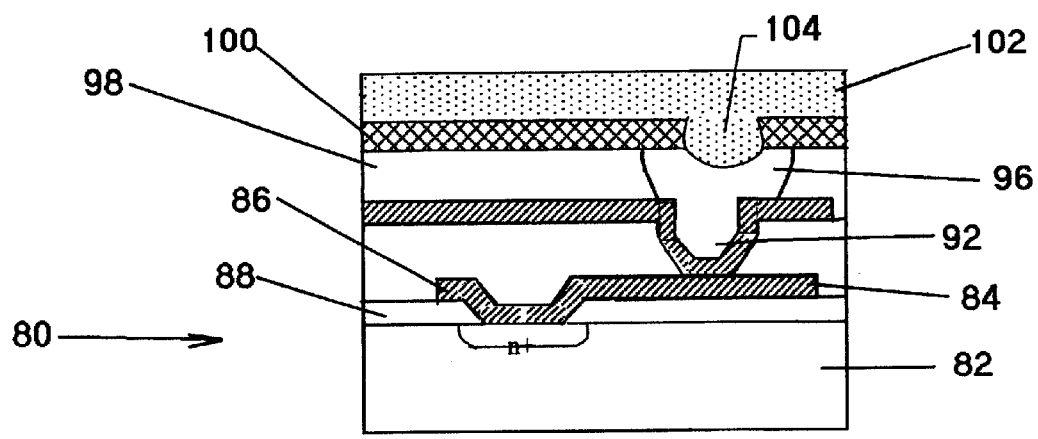
FIGS. 11 through 13 are fragmentary cross sectional view of packages according to further embodiments of the invention.

In a multiple level configuration as shown in FIG. 11, an IC device 80 includes a base substrate 82 having circuit path 84 including contact 86 formed on and through the first insulating layer 88 as described above. A second layer circuit path 90 includes a via 92 formed in an opening for the second insulating layer 94 as described above, at a stress sensitive connection with the path 84. A chamber 96 is formed in the third insulating layer 98 through an access opening in the protective layer 100. The encapsulating layer 102 including plug 104 is formed over the layer 100 to form the buffer chamber 96.

Figure 12:
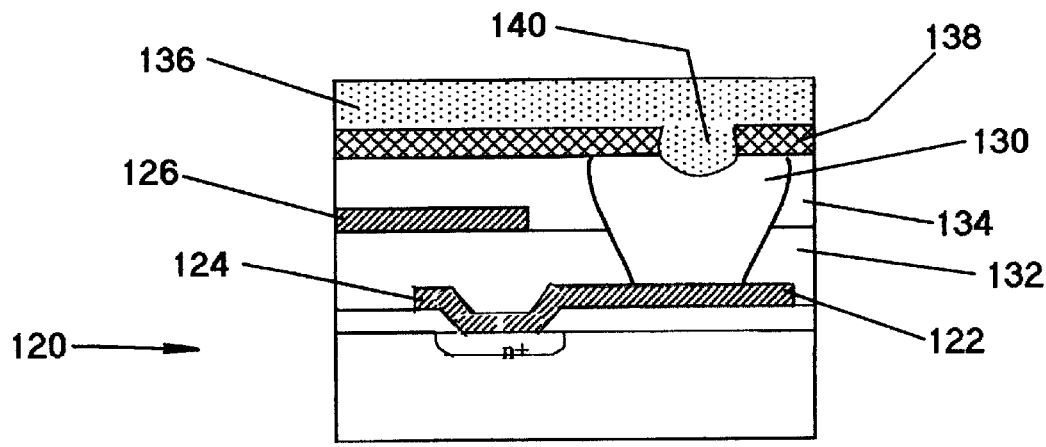
Figure 13:
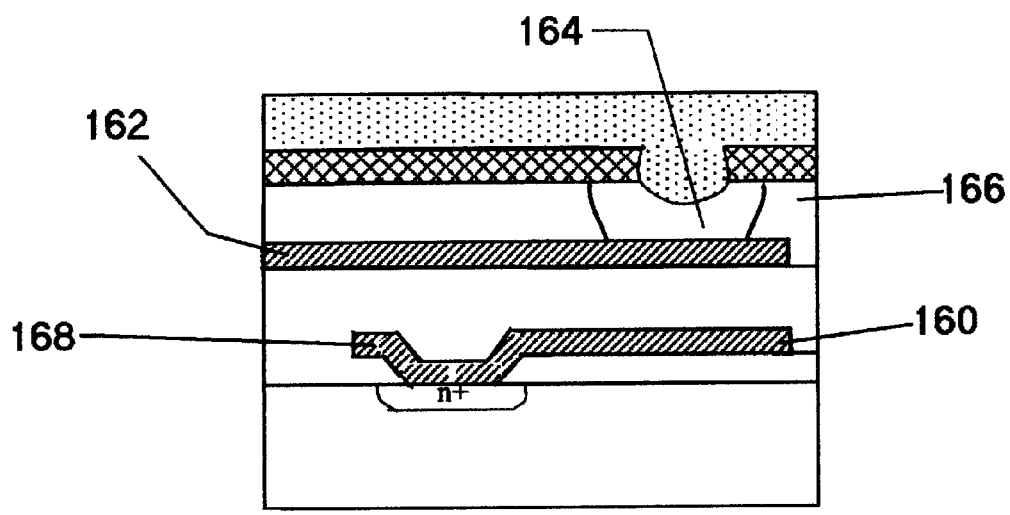

As shown in FIG. 12, the present invention may also be employed to limit stress effects in multiple access circuitry schemes where direct buffering is not possible due to the architecture. Therein, the device 120 includes a base level including circuitry 122 wherein the contact 124 is partially overlaid by secondary level circuitry 126. To limit transmitted stresses at the contact 124, a buffer chamber 130 is established in both the second and third insulation areas, 132 and 134 respectively. The device is encapsulated as described above, with the outer molded layer 136 surrounding the protective layer 138 with the plug 140 terminating at the chamber 130. Additionally, as shown in FIG. 13, where the second level circuitry 160 overlies direct access to the first level circuitry 162, the chamber 164 may be established at the third insulation layer 166 sufficiently proximate the first level contact 168 to obviate stress induced effects.

The invention is not limited to the specified parameters set forth above and the novel structure is also applicable to an n-type substrate.

What is claimed is:

1. In the fabrication of an integrated circuit having stress-sensitive circuitry sites, a method for reducing stress-induced effects on the performance of the integrated circuit, compromising the steps of:
   a. forming a diffusion area in a base substrate;
   b. forming a first insulating layer over said base substrate and said diffusion area;
   c. forming an electrically conductive layer over said first insulating layer and establishing a stress sensitive electrical connection at said diffusion area;
   d. removing select portions of said conductive layer to establish a circuitry pattern;
   e. forming a first protection layer over said circuitry pattern and said first insulating layer;
   f. forming a second protection layer over said first protection layer;
   g. forming an opening in said second protection layer positioned vertically at a stress sensitive electrical connection within the margins thereof;
   h. removing in processing through said opening in said second protection layer portions discrete portions of said first protection layer to establish a buffer chamber vertically bounded by said second protection layer and said connection and outwardly bounded by a peripheral wall within the margins of said connection and outwardly of the margins of said opening;
   i. encapsulating said second layer with a viscous molding compound, said opening and the viscosity of said compound being interrelated to limit inward penetration of said compound into said chamber, thereby providing a stress relieving void limiting induced thermal and mechanical stresses at said connection.

2. The method as recited in claim 1 wherein said first insulating layer is thermal oxide, a deposited oxide, or a deposited boro-phosphosilicate glass (BPSG).

3. The method as recited in claim 1 wherein said conductive layer is aluminum, copper or alloys thereof.

4. The method as recited in claim 1 wherein said first protection layer is a thermal oxide or phosphosilicate glass (PSG).

5. The method as recited in claim 1 wherein said second protection layer is silicon nitride ($Si_3N_4$) or silicon oxynitride (SiON).

6. The method as recited in claim 1 wherein said opening are aligned with said buffer chamber and said stress-sensitive connection.

7. A semiconductor device made in accordance with the method recited in claim 1.

8. An integrated circuit chip package comprising: an integrated circuit chip having a stress sensitive area; a first layer overlying said chip to the exclusion of said stress sensitive area as characterized by a first opening thereat; a second layer overlying said first layer and establishing at said first opening a buffer chamber, said second layer having a second opening registering with said buffer chamber; and a viscous encapsulating compound enclosing said second layer wherein the applied viscosity of said compound and the size of said second opening are related to prevent substantially said viscous encapsulating compound from occupying buffer chamber.

9. The integrated circuit chip package as recited in claim 8 wherein said first opening in said first layer is established in an etching process.

10. The integrated circuit chip package as recited in claim 9 wherein said first layer is formed of an insulating material.

11. The integrated circuit chip package as recited in claim 10 wherein said insulating material is selected from the group comprising a thermal oxide, a deposited oxide or a deposited boro-phosphosilicate glass.

12. The integrated circuit chip package as recited in claim 8 wherein said second opening in said second layer is substantially greater in area than said first opening.

13. The integrated circuit chip package as recited in claim 10 wherein said second layer is formed of a silicon nitride material.

14. The integrated circuit chip package as recited in claim 13 wherein said silicon nitride material is silicon nitride or silicon oxynitride.

* * * * *